(12) United States Patent
Felton et al.

(10) Patent No.: US 10,912,190 B2
(45) Date of Patent: Feb. 2, 2021

(54) ELECTRICAL CONNECTOR ELEMENT

(71) Applicant: EMC IP Holding Company, LLC, Hopkinton, MA (US)

(72) Inventors: Mickey S. Felton, Princeton, MA (US); Bhyrav M. Mutnury, Austin, TX (US); Vijendera Kumar, Bangalore (IN)

(73) Assignee: EMC IP Holding Company, LLC, Hopkinton, MA (US)

(*) Notice: Subject to any disclaimer, the term of this patent is extended or adjusted under 35 U.S.C. 154(b) by 0 days.

(21) Appl. No.: 16/276,140

(22) Filed: Feb. 14, 2019

(65) Prior Publication Data
US 2019/0254158 A1 Aug. 15, 2019

(30) Foreign Application Priority Data

Feb. 14, 2018 (IN) .............................. 201811005533

(51) Int. Cl.
H05K 1/02 (2006.01)
H05K 1/11 (2006.01)

(52) U.S. Cl.
CPC ............ *H05K 1/025* (2013.01); *H05K 1/0243* (2013.01); *H05K 1/111* (2013.01); *H05K 2201/09418* (2013.01)

(58) Field of Classification Search
CPC ....... H05K 1/025; H05K 1/0243; H05K 1/111; H05K 2201/09418
USPC .......................................................... 174/261
See application file for complete search history.

(56) References Cited

U.S. PATENT DOCUMENTS

| 9,406,629 | B2* | 8/2016 | Tseng | H01L 23/3142 |
| 2006/0238922 | A1* | 10/2006 | Hanyu | G11B 5/6005 |
| | | | | 360/235.8 |
| 2011/0292625 | A1* | 12/2011 | Chen | H05K 1/0295 |
| | | | | 361/768 |

* cited by examiner

*Primary Examiner* — Tremesha S Willis
(74) *Attorney, Agent, or Firm* — Brian J. Colandreo; Mark H. Whittenberger; Holland & Knight LLP

(57) ABSTRACT

An electrical connector element, for use on a printed circuit board assembly, includes a soldering pad having a longitudinal length and a cross-sectional width. The soldering pad is configured to be electrically-coupleable to a PCB device conductor. At least one impedance inducing feature is positioned along the longitudinal length of the soldering pad.

20 Claims, 3 Drawing Sheets

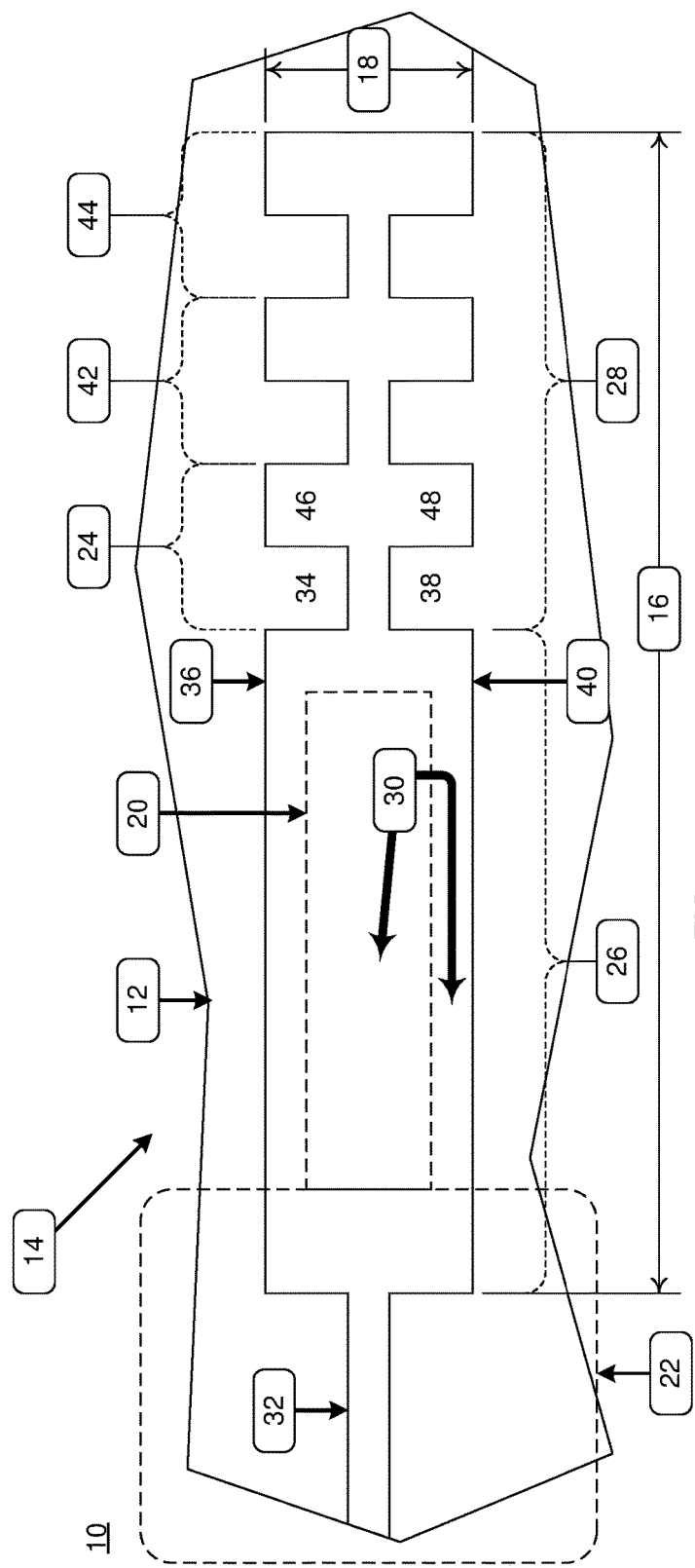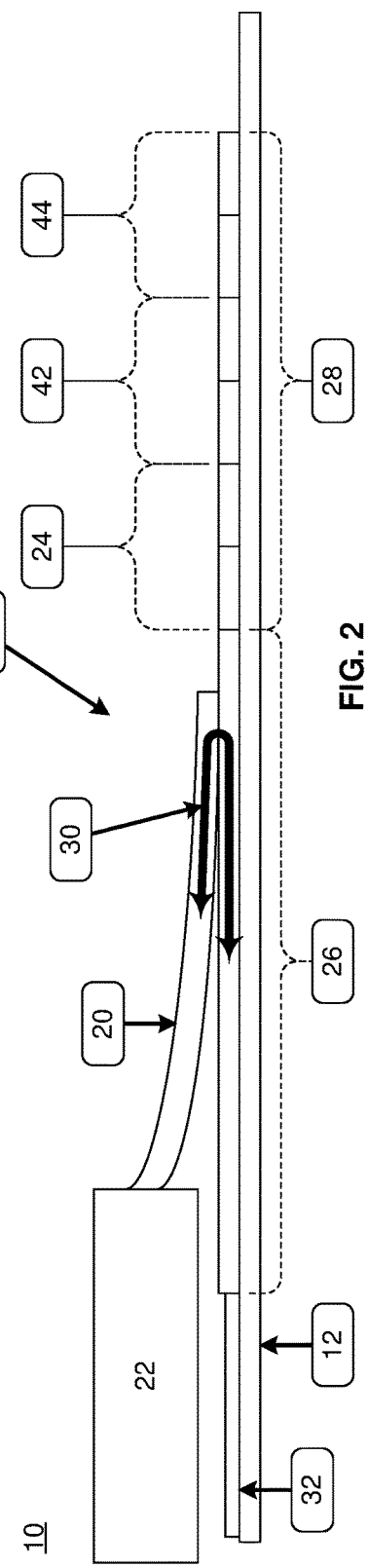

ELECTRICAL CONNECTOR ELEMENT

RELATED APPLICATION

The subject application claims the priority of India Patent Application No. 201811005533, filed on 14 Feb. 2018, the contents of which are herein incorporated by reference in its entirety.

TECHNICAL FIELD

This disclosure relates to soldering pads and, more particularly, to soldering pads for use with SMT systems.

BACKGROUND

Surface Mount Technology (SMT) connectors are becoming a preferred choice for high-speed signaling, as these connectors provide better impedance control and also help with respect to backdrilling connector high speed vias.

Conventional connectors (e.g., plated through hole (PTH) or press-fit connectors) do not provide the same signal integrity benefits as SMT connectors because they need a certain amount of depth for the connector pin. This depth makes routing a challenge (especially for speeds beyond 20 Gbps), as the connector pin may act like an open stub (e.g., a transmitter), adversely impacting signal integrity. Due to the advantages provided by SMT connectors, a lot of next-generation connectors are becoming SMT in nature.

Unfortunately, one of the challenges with SMT connectors is their PAD design. For example, if the signal breakout portion (of the pad) and the SMT lead frame portion (of the pad) are the same, it would result in problems at high speeds beyond 20 Gbps. And with SAS 4.0 going to 22.5 Gbps, CCIX & Gen-Z at 25.0 Gbps, and PCIe Gen5 going to 32.0 Gbps, these challenges with SMT signal breakout are becoming very important.

SUMMARY OF DISCLOSURE

In one implementation, an electrical connector element, for use on a printed circuit board assembly, includes a soldering pad having a longitudinal length and a cross-sectional width. The soldering pad is configured to be electrically-coupleable to a PCB device conductor. At least one impedance inducing feature is positioned along the longitudinal length of the soldering pad.

One or more of the following features may be included. The soldering pad may be longitudinally longer than the PCB device conductor. The soldering pad may include: a first longitudinal pad portion and a second longitudinal pad portion. The first longitudinal pad portion may be configured to receive the PCB device conductor. The at least one impedance inducing feature may be positioned within the second longitudinal pad portion. The first longitudinal pad portion may be electrically coupled to a PCB trace conductor. The at least one impedance inducing feature may be configured to increase the impedance of the second longitudinal pad portion. The at least one impedance inducing feature may include one or more non-conductive portions configured to reduce the cross-sectional width of the soldering pad. The one or more non-conductive portions may be rectangular non-conductive portions. The one or more non-conductive portions may include: a first non-conductive portion positioned on a first side of the soldering pad, and a second non-conductive portion positioned on a second side of the soldering pad. The electrical connector element may be an SMT electrical connector element. The electrical connector element may be configured for use with lower frequency signals and the at least one impedance inducing feature may include a single impedance inducing feature. The electrical connector element may be configured for use with higher frequency signals and the at least one impedance inducing feature may include a plurality of impedance inducing features.

In another implementation, an electrical connector element, for use on a printed circuit board assembly, includes a soldering pad having a longitudinal length and a cross-sectional width. The soldering pad is configured to be electrically-coupleable to a PCB device conductor. At least one impedance inducing feature is positioned along the longitudinal length of the soldering pad. The soldering pad is longitudinally longer than the PCB device conductor and includes: a first longitudinal pad portion configured to receive the PCB device conductor and a second longitudinal pad portion within which the at least one impedance inducing feature is positioned.

One or more of the following features may be included. The electrical connector element may be an SMT electrical connector element. The electrical connector element may be configured for use with lower frequency signals and the at least one impedance inducing feature may include a single impedance inducing feature. The electrical connector element may be configured for use with higher frequency signals and the at least one impedance inducing feature may include a plurality of impedance inducing features.

In another implementation, an electrical connector element, for use on a printed circuit board assembly, includes a soldering pad having a longitudinal length and a cross-sectional width. The soldering pad is configured to be electrically-coupleable to a PCB device conductor. At least one impedance inducing feature is positioned along the longitudinal length of the soldering pad. The soldering pad is longitudinally longer than the PCB device conductor and includes: a first longitudinal pad portion configured to receive the PCB device conductor and electrically coupled to a PCB trace conductor, and a second longitudinal pad portion within which the at least one impedance inducing feature is positioned, the at least one impedance inducing feature being configured to increase the impedance of the second longitudinal pad portion.

One or more of the following features may be included. The electrical connector element may be configured for use with lower frequency signals and the at least one impedance inducing feature may include a single impedance inducing feature. The electrical connector element may be configured for use with higher frequency signals and the at least one impedance inducing feature may include a plurality of impedance inducing features.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a top view of an electrical connector element;
FIG. 2 is a side view of the electrical connector element of FIG. 1.

Like reference symbols in the various drawings indicate like elements.

DETAILED DESCRIPTION OF THE PREFERRED EMBODIMENTS

Figure 3:
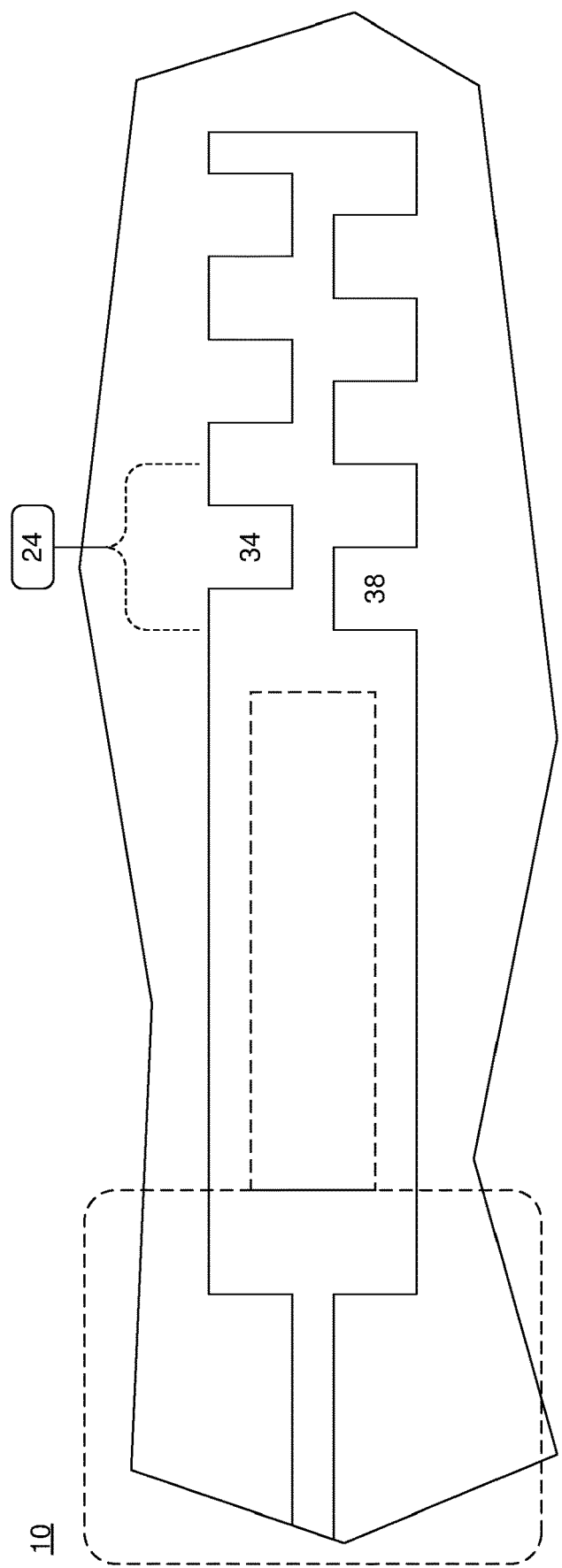
FIG. 3 is a top view of the electrical connector element of FIG. 1 including staggered non-conductive portions.

Referring to FIG. 1, there is shown a top view of electrical connector element 10 for use on PCB (i.e., printed circuit board) assembly 12. Referring also to FIG. 2, there is shown a side view of electrical connector element 10 of FIG. 1.

Electrical connector element 10 may include soldering pad 14 having a longitudinal length (e.g., longitudinal length 16) and a cross-sectional width (e.g., cross-sectional width 18). Soldering pad 14 may be configured to be electrically-coupleable to a PCB device conductor (e.g., PCB device conductor 20).

An example of PCB device conductor 20 may include but is not limited to a device conductor of a Surface Mount Technology component (e.g., SMT component 22), wherein examples of SMT component 22 may include but are not limited to an SMT integrated circuit, an SMT electronic component (e.g., a resistor, a capacitor, a transistor) and an SMT connector assembly. Accordingly, one example of electrical connector element 10 may include but is not limited to an SMT electrical connector element (e.g., an electrical connector element that is configured to establish an electrical connection with above-described SMT component 22).

Electrical connector element 10 may include at least one impedance inducing feature (e.g., impedance inducing feature 24) positioned along longitudinal length 16 of soldering pad 14. For various engineering and manufacturing reasons, soldering pad 14 may be longitudinally longer than PCB device conductor 20. For example, soldering pad 14 may include first longitudinal pad portion 26 and second longitudinal pad portion 28, wherein first longitudinal pad portion 26 may be configured to receive (and be electrically coupled to) PCB device conductor 20, while second longitudinal pad portion 28 may be essentially unused (and may not be needed) with respect to electrically coupling PCB device conductor 20 to soldering pad 14. Unfortunately, this unused portion (i.e., second longitudinal pad portion 28) may be considered a stub portion and (at higher signal frequencies) may act like a resonator, which may result in signal loss (with respect to signal 30) and a poor signal-to-noise ratio.

Accordingly and to address this issue, the at least one impedance inducing feature (e.g., impedance inducing feature 24) may be positioned within second longitudinal pad portion 28. Specifically, the at least one impedance inducing feature (e.g., impedance inducing feature 24) may be configured to increase the impedance of second longitudinal pad portion 28, thus raising the impedance seen by e.g., signal 30 in the direction of second longitudinal pad portion 28. This, in turn, "discourages" signal 30 from travelling in the direction of second longitudinal pad portion 28 and reduces the above-described signal loss. As will be discussed below in greater detail, the at least one impedance inducing feature (e.g., impedance inducing feature 24) may increase the impedance of second longitudinal pad portion 28 by narrowing the cross-sectional width (e.g., cross-sectional width 18) of soldering pad 14.

First longitudinal pad portion 26 may be electrically coupled to a PCB trace conductor (e.g., PCB trace conductor 32), wherein PCB trace conductor 32 may be coupled to various other components coupled to (or included within) PCB assembly 12. Accordingly, while signal 30 is "discouraged" from travelling in the direction of second longitudinal pad portion 28, the at least one impedance inducing feature (e.g., impedance inducing feature 24) may "encourage" signal 30 to: travel in the direction of PCB conductor 32 (and the various other components coupled to (or included within) PCB assembly 12) when signal 30 is originating in SMT component 22; or travel in the direction of SMT component 22 when signal 30 is originating in PCB conductor 32 (or the various other components coupled to (or included within) PCB assembly 12).

The at least one impedance inducing feature (e.g., impedance inducing feature 24) may include one or more non-conductive portions that may be configured to reduce cross-sectional width 18 of soldering pad 14. For example, the one or more non-conductive portions may include first non-conductive 34 positioned proximate a first side (e.g., first side 36) of soldering pad 14, and second non-conductive portion 38 positioned proximate a second side (e.g., second side 40) of soldering pad 14.

While impedance inducing feature 24 is shown in this example to include two non-conductive portions (e.g., non-conductive portions 34, 38), this is for illustrative purposes only and is not intended to be a limitation of this disclosure, as other configurations are possible and are considered to be within the scope of this disclosure. For example, impedance inducing feature 24 may be configured to only include a single non-conductive portion (e.g., non-conductive portion 34 or non-conductive portion 38).

Further, while non-conductive portions (e.g., non-conductive portions 34, 38) are shown in this example to be latitudinally-aligned, this is for illustrative purposes only and is not intended to be a limitation of this disclosure, as other configurations are possible and are considered to be within the scope of this disclosure. For example, non-conductive portions (e.g., non-conductive portions 34, 38) may be latitudinally-staggered (as shown in FIG. 3).

Figure 4:
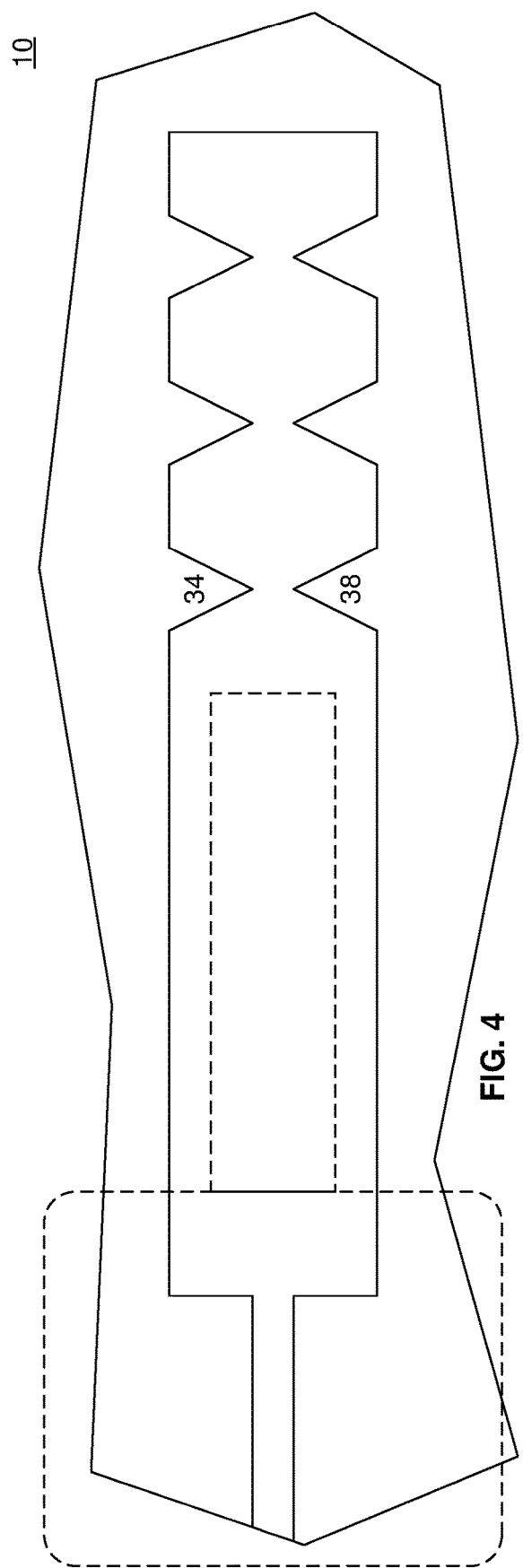
FIG. 4 is a top view of the electrical connector element of FIG. 1 including triangular non-conductive portions.
Figure 5:
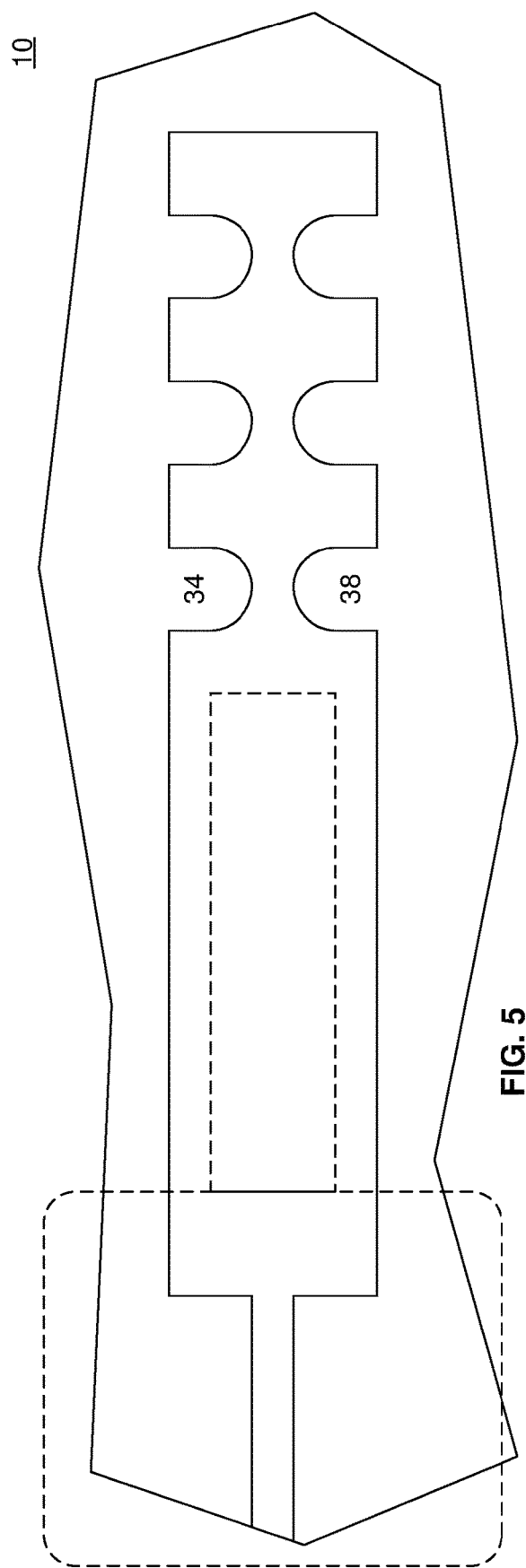
FIG. 5 is a top view of the electrical connector element of FIG. 1 including arc-shaped non-conductive portions.

And while the one or more non-conductive portions (e.g., non-conductive portions 34, 38) are shown to be rectangular non-conductive portions, this is for illustrative purposes only and is not intended to be a limitation of this disclosure, as other configurations are possible and are consider to be within the scope of this disclosure. For example, the one or more non-conductive portions (e.g., non-conductive portions 34, 38) may be triangular in shape (as shown in FIG. 4) or arc-shaped (as shown in FIG. 5).

Tuning

As discussed above, electrical connector element 10 may include at least one impedance inducing feature (e.g., impedance inducing feature 24) positioned along longitudinal length 16 of soldering pad 14, wherein the at least one impedance inducing feature (e.g., impedance inducing feature 24) may be configured to "discourage" signal 30 from travelling in the direction of second longitudinal pad portion 28 and "encourage" signal 30 to travel in the direction of PCB conductor 32 or SMT component 22.

Specifically and when electrical connector element 10 is configured for use with lower frequency signals, the at least one impedance inducing feature may include a single impedance inducing feature. Conversely and when electrical connector element 10 is configured for use with higher frequency signals, the at least one impedance inducing feature may include a plurality of impedance inducing features.

As discussed above, for various engineering and manufacturing reasons, soldering pad 14 may be longitudinally longer than PCB device conductor 20, wherein soldering pad 14 may include first longitudinal pad portion 26 and second longitudinal pad portion 28. First longitudinal pad portion 26 may be configured to receive PCB device conductor 20, while second longitudinal pad portion 28 may be essentially unused with respect to electrically coupling PCB device conductor 20 to soldering pad 14. Accordingly, second longitudinal pad portion 28 may be the portion of soldering pad 14 within which the at least one impedance inducing feature (e.g., impedance inducing feature 24) may be positioned.

Typically, the narrowest width of the one or more non-conductive portions (e.g., non-conductive portions 34, 38) is 2 mils (0.002 inches), wherein non-conductive portions having a narrower width may result in arcing across the non-conductive portions (e.g., non-conductive portions 34, 38). Accordingly, the non-conductive portions (e.g., non-conductive portions 34, 38) of the at least one impedance inducing feature (e.g., impedance inducing feature 24) should be at least 2 mils (0.002 inches) wide in order for the non-conductive portions (e.g., non-conductive portions 34, 38) to not arc and, therefore, be non-conductive.

As discussed above, the lower the frequency of signal 30, the fewer the quantity of impedance inducing features needed to avoid the above-described signal loss; while the higher the frequency of signal 30, the greater the quantity of impedance inducing features needed to avoid the above-described signal loss.

As is common in the industry, second longitudinal pad portion 28 typically has a length of 80 mils (0.080 inches). And when the length of second longitudinal pad portion 28 is indeed 80 mils (0.080 inches), the above-described signal loss does not start to become a problem until approximately 12 Gbps (above which, signal loss becomes a concern).

Mathematically, this pad length to signal loss relationship may be expressed as follows:

$$f \propto \frac{c}{\sqrt{\varepsilon r} L}$$

wherein:
f is the frequency of signal 30;
$\sqrt{\varepsilon r}$ is the dielectric constant of PCB assembly 12;
L is the length of second longitudinal pad portion 28; and
c is the velocity of light.

As can be seen from above, as the frequency of signal 30 increases, lengths (L) of second longitudinal pad portion 28 that previously were not a concern become more concerning. As discussed above, when the length (L) of second longitudinal pad portion 28 is at 80 mils or below, there are no signal loss issues up until signal 30 is in the 12 Gbps range. Accordingly, when the length (L) of second longitudinal pad portion 28 is above 12 Gbps, an 80 mil length (L) for second longitudinal pad portion 28 begins to be too long. Accordingly and through the use of the one or more impedance inducing features (e.g., impedance inducing feature 24), the effective length of second longitudinal pad portion 28 may be shortened while still providing the requisite level of connection robustness and pad adhesion between soldering pad 14 and PCB device conductor 20.

For example and as discussed above, when signal 30 is at or below 12 Gbps, signal loss may not be a concern. Accordingly, second longitudinal pad portion 28 may not need to include any impedance inducing features for this frequency range.

Further and as may be discovered empirically, when signal 30 is in the 12 Gbps to 16 Gbps range, signal loss may only be a slight concern. Accordingly, second longitudinal pad portion 28 may only need to include a single impedance inducing feature (e.g., impedance inducing feature 24) for this frequency range.

Additionally and as may be discovered empirically, when signal 30 is in the 16 Gbps to 25 Gbps range, signal loss may be a greater concern. Accordingly, second longitudinal pad portion 28 may need to include two impedance inducing features (e.g., impedance inducing features 24, 42) for this frequency range.

Further still and as may be discovered empirically, when signal 30 is above 25 Gbps, signal loss may be a great concern. Accordingly, second longitudinal pad portion 28 may need to include three or more impedance inducing features (e.g., impedance inducing feature 24, 42, 44) for this frequency range.

As the frequency of signal 30 continues to increase, additional impedance inducing features may be needed to address signal loss and achieve an acceptable signal-to-noise ratio, wherein the number of impedance inducing features includable within second longitudinal pad portion 28 may be limited by the physical length of second longitudinal pad portion 28. As discussed above, the narrowest width of the one or more non-conductive portions (e.g., non-conductive portions 34, 38) may be 2 mils (0.002 inches), wherein non-conductive portions having a narrower width may result in arcing across the non-conductive portions (e.g., non-conductive portions 34, 38). Accordingly and assuming that the conductive portions (e.g., conductive portions 46, 48) of each impedance inducing feature (e.g., impedance inducing feature 24) are also 2 mils (e.g., 0.002 inches) wide, the total width of an impedance inducing feature (e.g., impedance inducing feature 24) may be 4 mils. Therefore, a total of twenty impedance inducing features (e.g., impedance inducing feature 24) may be included within a second longitudinal pad portion (e.g., second longitudinal pad portion 28) that has a length of 80 mils (e.g., 0.080 inches).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An electrical connector element, for use on a printed circuit board assembly, comprising:
   a soldering pad having a longitudinal length and a cross-sectional width, the soldering pad configured to be electrically-coupleable to a PCB device conductor; and
   at least one impedance inducing feature positioned along the longitudinal length of the soldering pad, wherein the at least one impedance inducing feature is configured to increase the impedance of at least a portion of the soldering pad and direct a signal from the printed circuit board assembly to travel toward the PCB device conductor and away from the at least one impedance inducing feature when the soldering pad is electrically-coupled to the PCB device conductor.

2. The electrical connector element of claim 1 wherein the soldering pad is longitudinally longer than the PCB device conductor.

3. The electrical connector element of claim 2 wherein the soldering pad includes:
   a first longitudinal pad portion, and
   a second longitudinal pad portion.

4. The electrical connector element of claim 3 wherein the first longitudinal pad portion is configured to receive the PCB device conductor.

5. The electrical connector element of claim 3 wherein the at least one impedance inducing feature is positioned within the second longitudinal pad portion.

6. The electrical connector element of claim 3 wherein the first longitudinal pad portion is electrically coupled to a PCB trace conductor.

7. The electrical connector element of claim 3 wherein the at least one impedance inducing feature is configured to increase the impedance of the second longitudinal pad portion.

8. The electrical connector element of claim 3 wherein the at least one impedance inducing feature includes:
   one or more non-conductive portions configured to reduce the cross-sectional width of the soldering pad.

9. The electrical connector element of claim 8 wherein the one or more non-conductive portions are rectangular non-conductive portions.

10. The electrical connector element of claim 8 wherein the one or more non-conductive portions includes:
    a first non-conductive portion positioned on a first side of the soldering pad, and
    a second non-conductive portion positioned on a second side of the soldering pad.

11. The electrical connector element of claim 1 wherein the electrical connector element is an SMT electrical connector element.

12. The electrical connector element of claim 1 wherein the electrical connector element is configured for use with lower frequency signals and the at least one impedance inducing feature includes a single impedance inducing feature.

13. The electrical connector element of claim 1 wherein the electrical connector element is configured for use with higher frequency signals and the at least one impedance inducing feature includes a plurality of impedance inducing features.

14. An electrical connector element, for use on a printed circuit board assembly, comprising:
    a soldering pad having a longitudinal length and a cross-sectional width, the soldering pad configured to be electrically-coupleable to a PCB device conductor; and
    at least one impedance inducing feature positioned along the longitudinal length of the soldering pad;
    wherein the soldering pad is longitudinally longer than the PCB device conductor and includes:
       a first longitudinal pad portion configured to receive the PCB device conductor, and
       a second longitudinal pad portion within which the at least one impedance inducing feature is positioned, wherein the at least one impedance inducing feature is configured to increase the impedance of the second longitudinal pad portion and direct a signal from the printed circuit board assembly to travel toward the PCB device conductor and away from the at least one impedance inducing feature when the first longitudinal pad portion is electrically-coupled to the PCB device conductor.

15. The electrical connector element of claim 14 wherein the electrical connector element is an SMT electrical connector element.

16. The electrical connector element of claim 14 wherein the electrical connector element is configured for use with lower frequency signals and the at least one impedance inducing feature includes a single impedance inducing feature.

17. The electrical connector element of claim 14 wherein the electrical connector element is configured for use with higher frequency signals and the at least one impedance inducing feature includes a plurality of impedance inducing features.

18. An electrical connector element, for use on a printed circuit board assembly, comprising:
    a soldering pad having a longitudinal length and a cross-sectional width, the soldering pad configured to be electrically-coupleable to a PCB device conductor; and
    at least one impedance inducing feature positioned along the longitudinal length of the soldering pad;
    wherein the soldering pad is longitudinally longer than the PCB device conductor and includes:
       a first longitudinal pad portion configured to receive the PCB device conductor and electrically coupled to a PCB trace conductor, and
       a second longitudinal pad portion within which the at least one impedance inducing feature is positioned, the at least one impedance inducing feature being configured to increase the impedance of the second longitudinal pad portion and direct a signal from the printed circuit board assembly to travel toward the PCB device conductor and away from the at least one impedance inducing feature when the first longitudinal pad portion is electrically-coupled to the PCB device conductor.

19. The electrical connector element of claim 18 wherein the electrical connector element is configured for use with lower frequency signals and the at least one impedance inducing feature includes a single impedance inducing feature.

20. The electrical connector element of claim 18 wherein the electrical connector element is configured for use with higher frequency signals and the at least one impedance inducing feature includes a plurality of impedance inducing features.

* * * * *